(12) United States Patent
Xia et al.

(10) Patent No.: US 11,088,610 B2
(45) Date of Patent: Aug. 10, 2021

(54) DRIVING AND CONTROLLING METHOD FOR SWITCHING ELEMENT AND CIRCUIT THEREOF

(71) Applicant: Delta Electronics (Shanghai) Co., Ltd., Shanghai (CN)

(72) Inventors: Tao Xia, Shanghai (CN); Wenfei Hu, Shanghai (CN)

(73) Assignee: DELTA ELECTRONICS (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/988,739

(22) Filed: Aug. 10, 2020

(65) Prior Publication Data

US 2021/0050769 A1    Feb. 18, 2021

(30) Foreign Application Priority Data

Aug. 14, 2019  (CN) .......................... 201910749785.5

(51) Int. Cl.
  *H02M 1/08*     (2006.01)
  *H03K 17/567*   (2006.01)
  *H02M 1/38*     (2007.01)

(52) U.S. Cl.
  CPC ............... *H02M 1/08* (2013.01); *H02M 1/38* (2013.01); *H03K 17/567* (2013.01)

(58) Field of Classification Search
  CPC ........ H02M 1/08; H02M 1/088; H02M 1/096; H02M 1/38; H02M 2001/385
  See application file for complete search history.

(56) References Cited

U.S. PATENT DOCUMENTS 5,371,517 A * 12/1994 Izzi .................. G06F 11/006
                                                345/589

FOREIGN PATENT DOCUMENTS

| CN | 101814728 B | 2/2013 |
| CN | 104022629 A | 9/2014 |
| CN | 103684014 B | 1/2016 |

* cited by examiner

*Primary Examiner* — Tomi Skibinski
(74) *Attorney, Agent, or Firm* — CKC & Partners Co., LLC

(57) ABSTRACT

A driving and controlling method and a circuit thereof are provided. The method includes: sending, by a primary controller, a first signal that includes a first type of pulse sequence and a second type of pulse sequence; receiving the first signal, by a secondary controller, and identifying a pulse type of the first signal; when a first type of pulse is detected, the secondary controller outputs multiple switching signals to respectively control multiple switching elements to turn off; when a second type of pulse is detected, the secondary controller outputs multiple switching signals to respectively control multiple switching elements to work as normal. A level of the first signal is maintained constant between the first type of pulse sequence and the second type of pulse sequence. The disclosure features cost-efficiency and low driving delay.

15 Claims, 7 Drawing Sheets

DRIVING AND CONTROLLING METHOD FOR SWITCHING ELEMENT AND CIRCUIT THEREOF

CROSS-REFERENCE TO RELATED APPLICATIONS

This application claims priority to Chinese Patent Application No. 201910749785.5, filed on Aug. 14, 2019, which is hereby incorporated by reference in its entirety.

TECHNICAL FIELD

The disclosure relates to the technical field of power electronics and, in particular, to a driving and controlling method for a switching element, and a circuit thereof.

BACKGROUND

A controlling circuit in a power electronic device belongs to a micro-electronic circuit (also known as information electronic circuit), which operates at low voltage and small current. The control circuit is typically in direct contact with power circuits which have high voltage and large current. In order to prevent the control circuit from being damaged by the high voltage and large current, a driving and controlling circuit must provide electrical isolation for the control circuit in addition to amplifying control signals sent from the control circuit.

In a power electronic device that requires medium voltage isolation, driving information is transferred via a medium such as optic fiber. As shown in FIG. 1, a primary controller sends driving information for switching tubes Q1 to Q4 to a secondary controller via isolation optic fibers. The optic fibers include a driving optic fiber, a protecting optic fiber and a status optic fiber. The driving optic fiber transfers switching signals. Then, a dead zone is added to the switching signals to control complementary switches. When a logic signal "0" is transferred via the driving optic fiber, the protecting optic fiber implements latching control over the switching signals to realize the handover between normal driving and protective latching. However, the additional protecting optic fiber adds the cost.

In another prior art, encoding and decoding is employed to transmit switching signals and protecting signal, which can eliminate the protecting optic fiber and reduce the cost. However the encoding and decoding will introduce high delay, and has been creating difficulty in fulfilling high-frequency switching and rapid latching.

SUMMARY

In a first aspect, an embodiment of the disclosure provides a driving and controlling method, applied to a driving and controlling circuit for driving multiple switching elements, the driving and controlling circuit including a primary controller, a secondary controller, and an isolation communication unit, the primary controller being coupled to the secondary controller via the isolation communication unit, the secondary controller being coupled to the switching element, and the method including:

sending, by the primary controller, a first signal that includes a first type of pulse sequence and a second type of pulse sequence; receiving, by the secondary controller, the first signal, and identifying a pulse type of the first signal;

when a first type of pulse is detected, outputting, by the secondary controller, multiple switching signals to respectively control multiple switching elements to turn off;

when a second type of pulse is detected, outputting, by the secondary controller, multiple switching signals to respectively control multiple switching elements to work as normal;

and a level of the first signal is maintained constant between the first type of pulse sequence and the second type of pulse sequence.

In a potential design, the multiple switching elements include a first switch and a second switch, the secondary controller receives the first signal and then outputs a second signal and a third signal to control the first switch and the second switch, respectively;

when the first type of pulse is detected, outputting the second signal and the third signal at an equal and constant level;

when the second type of pulse is detected, outputting the second signal and the third signal as complementary signals with dead zones.

In a potential design, the sending, by the primary controller, a first signal includes:

generating a latching signal, when the latching signal is valid, the primary controller sends the first type of pulse sequence which includes N first type of pulses, N being an integer greater than or equal to one;

when the latching signal is invalid, the primary controller sends the second type of pulse sequence.

In a potential design, a pulse width of the first type of pulse is smaller than that of the second type of pulse.

In a potential design:

when the first type of pulse has been detected, the secondary controller operates in a latched mode and stops detecting the first signal;

when a latching duration is reached, the secondary controller switches to a waiting mode and detects a transition edge in the first signal; and when the transition edge is detected by the secondary controller, the secondary controller switches to a working mode.

In a potential design, the first type of pulse sequence includes N first type of pulses, the latching duration begins from a moment at which an M-th pulse of the first type of pulse sequence terminates, and the latching duration terminates at a moment which is later than or equal to the moment of the first type of pulse sequence terminating, where N is an integer, N≥1, and M is an integer, 1≤M≤N.

In a potential design, when the secondary controller is in the latched mode or the waiting mode, the multiple switching signals are at an equal and constant level; and when the secondary controller is in the working mode, the multiple switching signals are complementary signals with dead zones.

In a potential design, when the first type of pulse has been detected and a pulse width thereof is less or equal to a dead time, the secondary controller switches to a waiting mode and detects a transition edge in the first signal; and when the transition edge is detected, the secondary controller switches to a working mode.

In a potential design, when the secondary controller is in the waiting mode, the multiple switching signals are at an equal and constant level; and when the secondary controller is in the working mode, the multiple switching signals are complementary signals with dead zones.

In a second aspect, an embodiment of the disclosure provides a driving and controlling circuit, including: a primary controller configured to send a first signal that includes a first type of pulse sequence and a second type of pulse sequence; an isolation communication unit coupled to the primary controller and configured to transmit the first signal; a secondary controller coupled between the isolation communication unit and multiple switching elements, and configured to receive the first signal and output multiple switching signals to respectively control the multiple switching elements, where a level of the first signal is maintained constant between the first type of pulse sequence and the second type of pulse sequence.

In a potential design, the primary controller includes: a latching module configured to detect a latching event and output a latching signal; and a pulse generating module electrically connected to the latching module, and configured to receive the latching signal, and generate the first signal;

when the latching signal is valid, the pulse generating module outputs the first type of pulse sequence; and when the latching signal is invalid, the pulse generating module outputs the second type of pulse sequence.

In a potential design, when the latching signal is valid and the first type of pulse sequence terminates, the pulse generating module outputs a constant level.

In a potential design, the secondary controller includes:

a dead zone module configured to receive the first signal and convert the first signal into multiple internal signals that are complementary signals with dead zones;

a starting and protecting module electrically connected to the dead zone module and the isolation communication unit, and configured to receive the multiple internal signals and the first signal, and identify a pulse type of the first signal, where when a first type of pulse is detected, the starting and protecting module outputs the multiple switching signals that are at an equal and constant level; and when a second type of pulse is detected, the starting and protecting module outputs the multiple internal signals.

In a potential design, the first type of pulse sequence includes N first type of pulses, N being an integer, N≥1, and a pulse width of the first type of pulse is smaller than that of the second type of pulse.

In a potential design, when the latching signal is invalid, the starting and protecting module outputs the multiple switching signals as complementary signals with dead zones to cause the switching elements to work as normal; and when the latching signal is valid, the starting and protecting module outputs the multiple switching signals at an equal and constant level to cause the multiple switching elements to stop working.

BRIEF DESCRIPTION OF THE DRAWINGS

In order to more clearly illustrate the embodiments of the present disclosure or the technical solutions in the prior art, the drawings required in describing the embodiments or the prior art will be briefly introduced below. Apparently, the drawings described in the following are for some embodiments of the present disclosure, and other drawings can be obtained by those skilled in the art without paying any creative labor.

DESCRIPTION OF EMBODIMENTS

In order to make objectives, technical solutions and advantages of embodiments of the present disclosure clearer, the technical solutions in the embodiments of the present disclosure will be described hereunder clearly and comprehensively with reference to accompanying drawings. Obviously, the described embodiments are only a part of embodiments of the present disclosure, rather than all of them. All the other embodiments derived by a person skilled in the art based on the embodiments of the present disclosure without making any creative effort shall fall within the scope of the present disclosure.

The terms "first", "second", "third", "fourth", etc. (if present) in the specification and claims of the present disclosure and the aforementioned drawings are used to distinguish similar objects without necessarily describing any specific sequence or order. It is to be understood that the number used as such may be interchanged as appropriate, as long as the embodiments of the disclosure described herein can be implemented, for example, in a sequence other than those illustrated or described herein. In addition, the terms "include" and "having" and their variations in any form are intended to cover a non-exclusive inclusion. For example, a process, method, system, product or device that "includes" a series of steps or units is not necessarily limited to those enlisted steps or units. Rather, they may include other steps or units not explicitly listed or inherent to such process, method, system, product or device.

Now, the technical solution of the present disclosure will be detailed with reference to specific embodiments. The following specific embodiments may be recombined with each other, and the same or similar concepts or processes may not be repeated in some embodiments.

Figure 1:
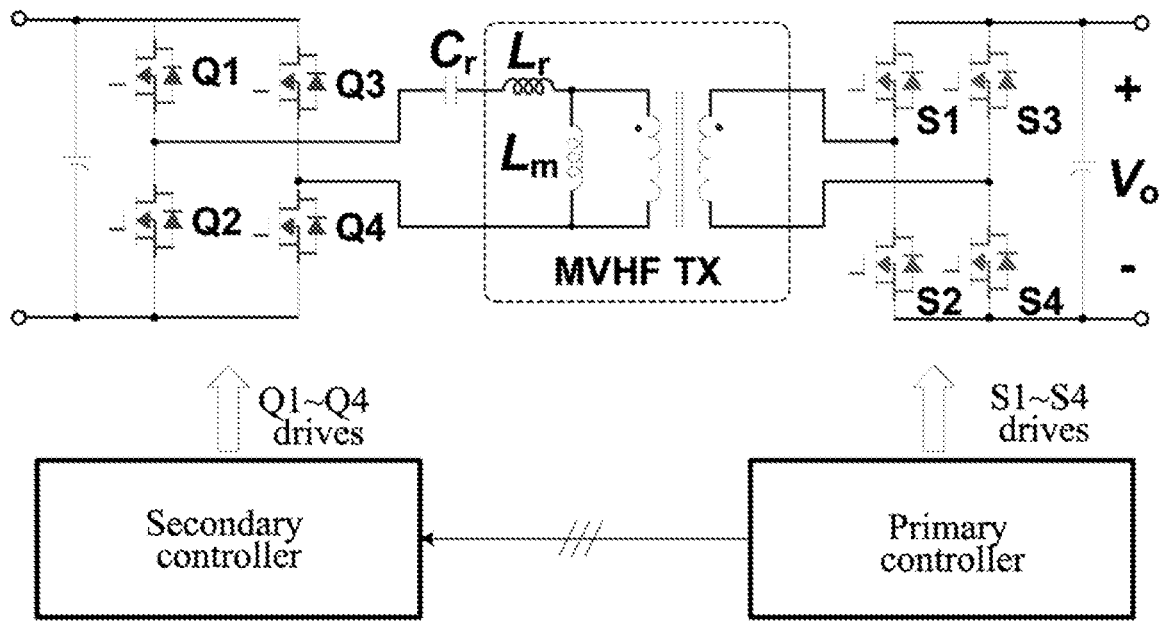
FIG. 1 is a schematic structural view of a driving and controlling circuit for a switching element as provided in a prior art embodiment.
Figure 2:
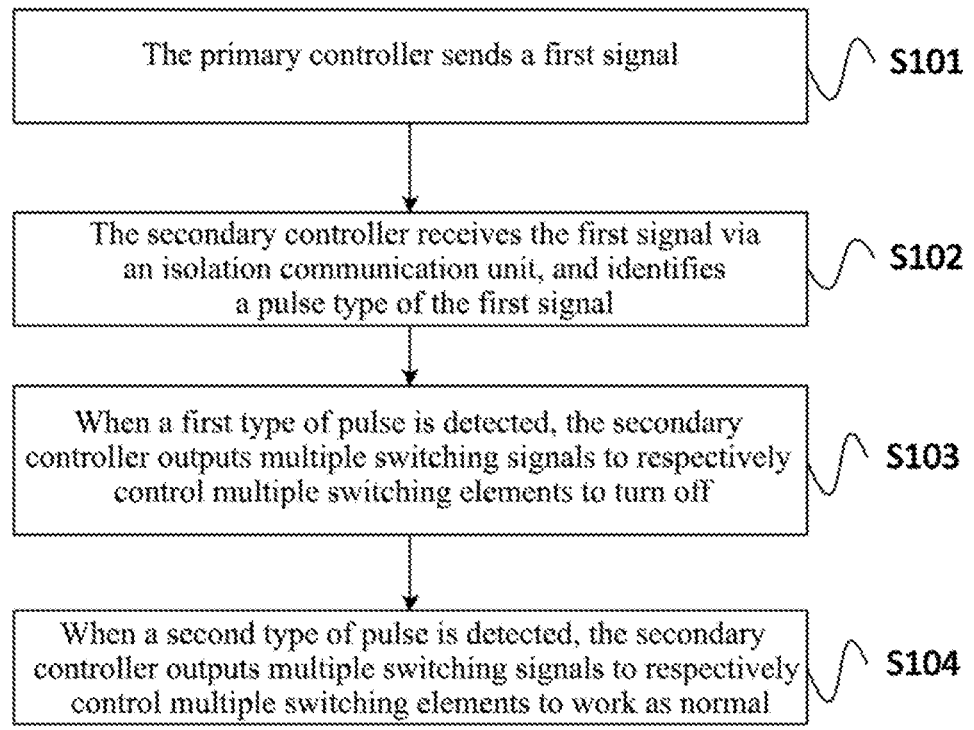
FIG. 2 is a flowchart of a driving and controlling method for a switching element as provided in Embodiment 1 of the disclosure.
Figure 3:
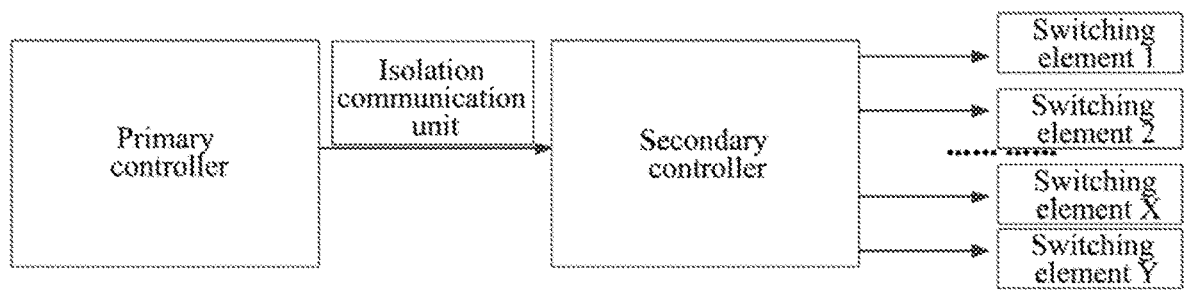
FIG. 3 is a schematic structural view of a driving and controlling circuit for a switching element as provided in Embodiment 1 of the disclosure.

FIG. 2 is a flowchart of a driving and controlling method as provided in Embodiment 1 of the disclosure, and FIG. 3 is a schematic structural view of a driving and controlling circuit as provided in Embodiment 1 of the disclosure. Referring to FIG. 2 and FIG. 3, the driving and controlling circuit is used for driving multiple switching elements, and includes a primary controller, a secondary controller, and an isolation communication unit. The primary controller is coupled to the secondary controller via the isolation communication unit, and the secondary controller is coupled to the switching elements. The primary controller is used for sending a first signal that includes a first type of pulse sequence and a second type of pulse sequence. The level of the first signal is maintained constant between the first type of pulse sequence and the second type of pulse sequence. The isolation communication unit is used for transmitting the first signal sent from the primary controller to the secondary controller. The secondary controller is used for receiving the first signal and outputting multiple switching signals to control the multiple switching elements respectively.

As shown in FIG. 2, the driving and controlling method may include the steps S101~S104.

S101, the primary controller sends a first signal that includes a first type of pulse sequence and a second type of pulse sequence.

In this embodiment, the primary controller generates a latching signal. When the latching signal is valid, the primary controller sends the first type of pulse sequence; and when the latching signal is invalid, the primary controller sends the second type of pulse sequence. A pulse width of a pulse within the first type of pulse sequence is different from a pulse width of a pulse within the second type of pulse sequence. The first type of pulse sequence includes N first type of pulses, N being an integer greater than or equal to 1. The N first type of pulses are continuous. In an optional embodiment, the primary controller may detect a latching event and output the latching signal, and the latching event may include any one or a combination of start-stop signal invalid, fault signal valid, qualifier signal valid.

S102, the secondary controller receives the first signal via the isolation communication unit, and identifies a pulse type of the first signal.

Figure 4:
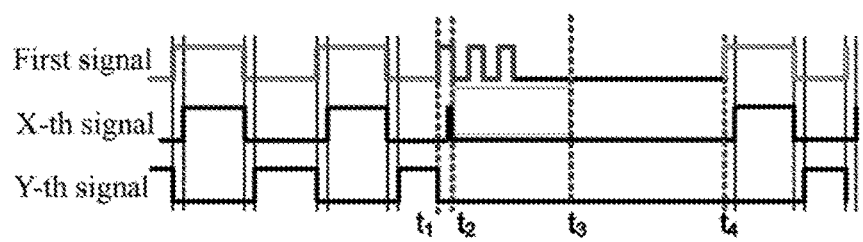
FIG. 4 is a waveform diagram of the driving and controlling method as provided in Embodiment 1 of the disclosure.

FIG. 4 is a waveform diagram of the driving and controlling circuit as provided in Embodiment 1 of the disclosure. The primary controller sends the first signal. Please refer to FIG. 4, at moment t1, the primary controller sends the first type of pulse sequence which includes three continuous first type of pulses. The first type of pulses are narrow pulses. At moment t4, the primary controller sends the second type of pulse sequence which includes multiple continuous second type of pulses. The second type of pulses are normal driving pulses. The level of the first signal is maintained constant between the first type of pulse sequence and the second type of pulse sequence. The first type of pulse has a less pulse width than the second type of pulse. That is to say, the narrow pulse has the less pulse width than the driving pulse. The secondary controller receives the first signal via the isolation communication unit and outputs multiple switching signals to control multiple switching elements respectively. As shown in FIG. 4, the secondary controller outputs an X-th signal to control a switching element X and a Y-th signal to control a switching element Y.

S103, when a first type of pulse is detected, the secondary controller outputs multiple switching signals to respectively control multiple switching elements to turn off. And S104, when a second type of pulse is detected, the secondary controller outputs multiple switching signals to respectively control multiple switching elements to work as normal.

Referring to FIG. 4, within the period t1-t2, the secondary controller has detected the first narrow pulse and is switched to a latched state. After the first narrow pulse is completely detected, all switching elements are required to turn off. In order to reliably turn off the switching element, the secondary controller stops detecting the first signal during the period t2-t3. After the moment t2, the secondary controller outputs the X-th signal and Y-th signal which are at a constant level. The X-th signal and Y-th signal control the switching element X and switching element Y to stop working, respectively. At the moment t4, the secondary controller detects a transition edge. For example, the transition edge is a rising edge. When the secondary controller detects the transition edge, a second type of pulse is detected. From the moment t4, the X-th signal and Y-th signal output by the secondary controller are complementary signals with dead zones. The X-th signal and Y-th signal respectively control the switching element X and switching element Y to work as normal, and the circuit is switched from the latched state to a working state.

At the moment t4, the primary controller releases the driving circuit from lock-out, and the secondary controller is in a ready state. So the primary controller commences sending a second type of pulse, and the transition edge that belongs to the normal driving pulse is detected by the secondary controller. That is to say, the secondary controller detects the second type of pulse and begins receiving the second type of pulse at the moment T4.

Further, the level of the first signal is maintained constant between the first type of pulse sequence and the second type of pulse sequence. As shown in FIG. 4, the first signal is maintained at a low level between the narrow pulse and the normal driving pulse. Of course, the disclosure is not limited thereto. Alternatively, the level of the first signal may also be maintained at a high level between the first type of pulse sequence and the second type of pulse sequence.

According to the driving and controlling method of this embodiment, rapid switching between latching and starting is implemented, and the handover duration can be reduced to the duration of the first type of pulse sequence. The driving information and latching information are transferred by single optic fiber in a time divisional manner, so that the number of optic fibers is reduced and the cost can be saved. The driving information is directly transferred via the optic fiber, shortening driving delay and obtaining high accuracy. Thus, the high frequency switching, high frequency Burst mode, and cycle-by-cycle protection can be realized.

When the load is light, the DC/DC converter is operated in the Burst mode to get lower gain, or reduce loss. When the output voltage of the DC/DC converter reaches an upper limit value, the DC/DC converter enters Burst-Off mode to shut down the switch elements by blocking the driving pulse of switching element, so that the output voltage drops. When the output voltage reaches a lower limit value, the DC/DC converter enters Burst-On mode to send driving pulse to the switching elements, so that the output voltage rises. Thus, the handover between the Burst-On mode and Burst-Off mode repeats. If the handover time from latching to starting lasts longer the interval $T_{off}$ of the Burst-Off mode, the output voltage will drop below its lower limit value, which means a ripple voltage exceeds its target value. By using the driving and controlling method in this embodiment, the rapid handover between latching and starting can be implemented, and the switching time from latching to starting is shorter than $T_{off}$, which is advantageous in controlling and reducing the ripples in the output voltage.

The DC/DC converter may be operated in the Cycle-by-Cycle current-limiting protection mode of inductive current. The handover between latched operating and normal working must be faster during the Cycle-by-Cycle current-limiting protection mode. When the Cycle-by-Cycle current-limiting is carried out, the switch element should be turned off within one switching cycle during which the inductive current is overloading, and the normal operation will be resumed in the next cycle. The handover time between latching and starting lasts so long that the switching elements keep off after the inductive current has dropped below its lower limit value. As a result, the current ripple will increase, and the current limiting performance will degrade. The driving and controlling method in this embodiment can implement rapid handover between latching and starting, so as to resume the normal operation of the switching elements before the current drops to its lower limit value, which is advantageous in controlling the inductive current.

Figure 5:
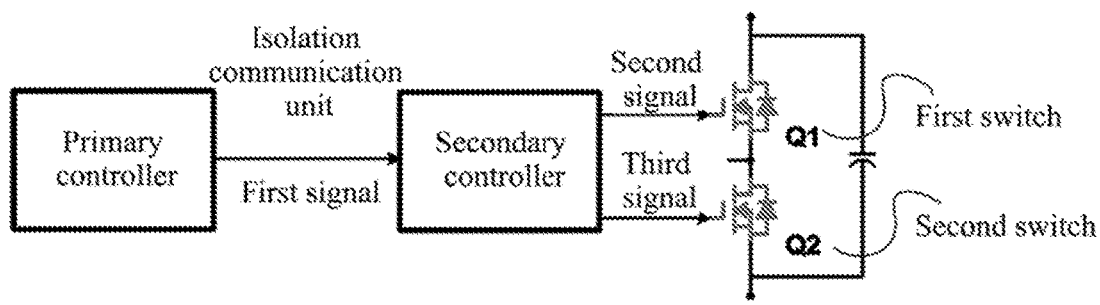
FIG. 5 is a schematic structural view of a driving and controlling circuit for a switching element as provided in Embodiment 2 of the disclosure.

FIG. 5 is a schematic structural view of a driving and controlling system as provided in Embodiment 2 of the disclosure. As shown in FIG. 5, multiple switching elements include a first switch Q1 and a second switch Q2 connected in series. The first switch Q1 and second switch Q2 are Insulated Gate Bipolar Transistors (IGBTs), but the disclosure is not limited thereto. The switching elements connected in series may not be turned on simultaneously. Delay can occur for various reasons when high rate power width modulation (PWM) driving signal is transmitted to the control electrode of the power component. The dead zone time is a guard period arranged in place to prevent the IGBTs of the upper and lower bridge arm from being turned on simultaneously due to issues that may occur in relation to switching signal transmission rate in PWM output. That is, one IGBT is turned on, then turned off, and then, only after a period of delay another IGBT will be turned on, so as to avoid over burning the power component. Herein, the period of delay is the dead time.

In this embodiment, multiple switching elements include a first switch and a second switch. The secondary controller receives the first signal, and then outputs a second signal and a third signal to respectively control the first switch and the second switch. When the secondary controller detects the first type of pulse, the second signal and the third signal are at constant levels, and the level of the second signal is equal to the level of the third signal. It is noted that the secondary controller identifying a complete first type of pulse means the first type of pulse is detected. When the secondary controller detects a second type of pulse, the second signal and the third signal are complementary signals with dead zones.

Figure 6:
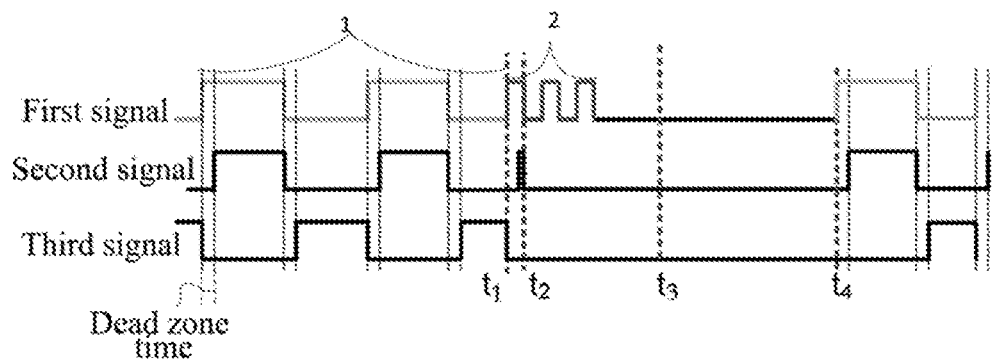
FIG. 6 is a waveform diagram of a driving and controlling method as provided in Embodiment 2 of the disclosure.

FIG. 6 is a waveform diagram of a driving and controlling method as provided in Embodiment 2 of the disclosure. As shown in FIG. 6, when the secondary controller detects a first type of pulse, i.e., a complete first type of pulse is detected within a period t1-t2, the secondary controller outputs the second signal and the third signal at an equal and constant level during the period t2-t4. That is to say, when a complete first type of pulse is detected, the second signal and the third signal output by the secondary controller are at constant levels and the level of the second signal is equal to the level of the third signal. For instance, the second signal and the third signal may both be at low levels, controlling the switching elements Q1 and Q2 to be off. The first type of pulse is a high frequency narrow pulse, and the first type of pulse sequence includes multiple continuous high frequency narrow pulses. In order to reliably turn off the switching elements, the secondary controller stops detecting the first signal during the period t2-t3.

At the moment t4, the primary controller releases the driving circuit from lock-out and the secondary controller is in a ready state, so the primary controller commences sending the second type of pulse. At the same time, the secondary controller detects the rising edge, and begins to receive the second type of pulses which are normal driving pulses. It is noted that the secondary controller detecting the transition edge indicates that the secondary controller has detected the second type of pulse. Thus, the secondary controller outputs the second signal and the third signal, which are complementary signals with dead zones, controlling the switching elements Q1 and Q2 to work as normal. The transition edge may be defined as a rising edge or a falling edge. During the dead zone time, neither the upper tube nor the lower tube has any output. Referring to FIG. 6, the dead zone time typically occupies merely a few percent of one cycle.

Figure 7:
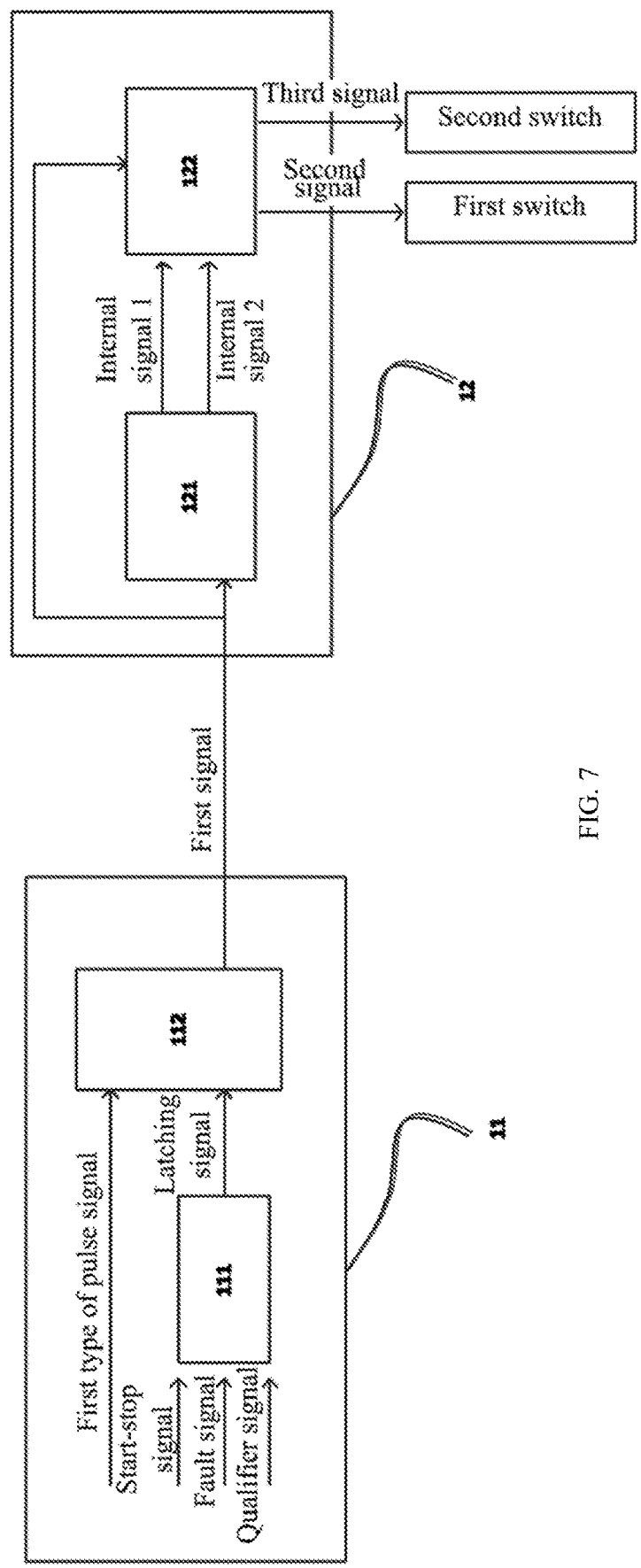
FIG. 7 is a schematic structural view of a driving and controlling circuit for a switching element as provided in Embodiment 3 of the disclosure.

FIG. 7 is a schematic structural view of a driving and controlling circuit as provided in Embodiment 3 of the disclosure. As shown in FIG. 7, the driving and controlling circuit includes the primary controller 11, the isolation communication unit and the secondary controller 12. The primary controller 11 includes a latching module 111 and a pulse generating module 112. The latching module 111 is configured to detect the latching event and output the latching signal. The latching module 111 synthesizes various information regarding whether the switching elements should be turned off, and generates the latching signal. For instance, when the converter is required to shut down according to dispatching commands, or immediate protections are needed owing to faults, or the burst mode or the cycle-by-cycle current-limiting mode should be operated, the latching signal is enabled. Otherwise, normal working is resumed. The latching event may include any one or a combination of: start-stop signal invalid, fault signal valid, qualifier signal valid. The start-stop signal may include control signals for startup or shutdown, such as a start enabling signal or a shutdown signal input by an operator. When the fault signal is valid, the primary controller enters directly into the latched mode to issue the latching signal. The qualifier signal may be an indication signal for the Burst mode or the Cycle-by-cycle current-limiting mode. When the qualifier signal is valid, the primary controller enters directly into the latched mode to issue the latching signal. The latching module makes logical decisions based on: the latching signal is valid while the start-stop signal is invalid, or the fault signal is valid or the qualifier signal is invalid; the latching signal is invalid while the start-stop signal is valid and the fault signal is invalid and the qualifier signal is invalid.

The pulse generating module 112 is electrically connected to the latching module 111, and is configured to receive the latching signal and generate the first signal. When the latching signal is valid, the pulse generating module 112 inserts N continuous narrow pulses into the first signal to create the first type of pulse sequence. When the latching signal is valid and the first type of pulse sequence has terminated, the pulse generating module 112 outputs a constant level. When the latching signal is invalid, the pulse generating module continuously outputs the normal driving pulses, creating the second type of pulse sequence. When the driving needs to be latched (the latching signal is valid), the pulse generating module 112 transmits a segment of narrow pulses and then a constant level. When the latching signal becomes invalid, the pulse generating module 112 transmits the normal driving signals.

The isolation communication unit is coupled to the primary controller 11, and is used for transmitting the first signal. The secondary controller 12 is coupled between the isolation communication unit and multiple switching elements. The secondary controller 12 includes a dead zone module 121 and a starting and protecting module 122. The dead zone module 121 receives the first signal sent from the isolation communication unit and converts the first signal into multiple internal signals that are complementary signals with dead zones. The starting and protecting module 122 is electrically connected to the dead zone module 121 to receive the multiple internal signals, and the starting and protecting module 122 is also electrically connected to the isolation communication unit to receive the first signal. The starting and protecting module 122 identifies the pulse type of the first signal. When the first type of pulse is detected, the starting and protecting module 122 outputs multiple switching signals that are at a constant level. When a second type of pulse is detected, the starting and protecting module 122 outputs multiple switching signals that are complementary signals with dead zones. That is, multiple internal signals are output as the switching signals.

Further, when the latching signal is invalid, the starting and protecting module 122 outputs multiple switching signals as complementary signals with dead zones to cause the switching elements to work as normal. When the latching signal is valid, the starting and protecting module 122 outputs the multiple switching signals at a constant level to cause the switching elements to stop working.

Figure 8:
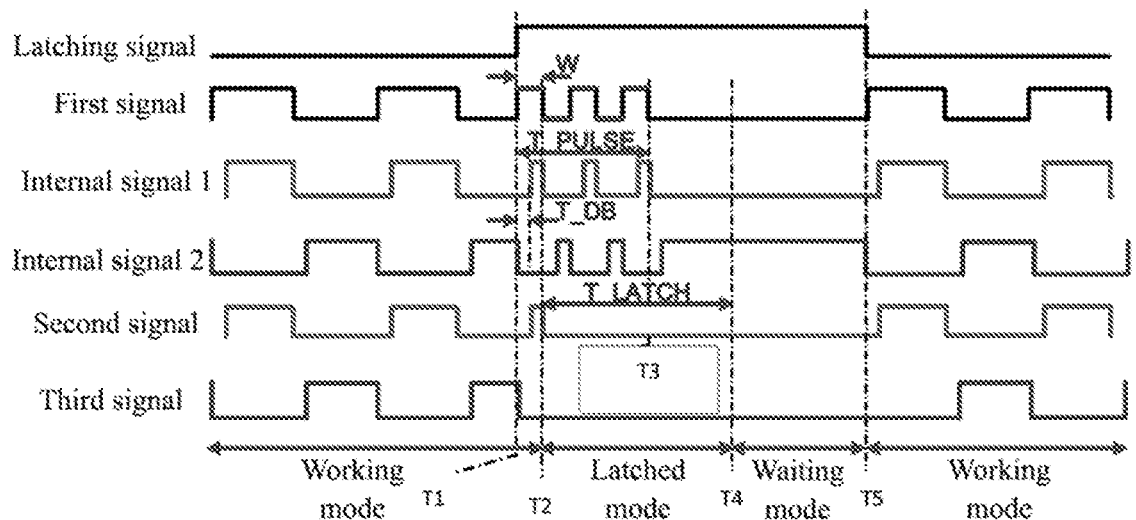
FIG. 8 is a waveform diagram of a driving and controlling method as provided in Embodiment 3 of the disclosure.

FIG. 8 is a waveform diagram of a driving and controlling method as provided in Embodiment 3 of the disclosure. In FIG. 7, the multiple switching elements may include a first switch and a second switch connected in series. Referring to FIG. 7 and FIG. 8 together, "W" is the width of the first type of pulse, "T_PULSE" is the duration of the first type of pulse sequence, "T_DB" is the dead zone time, "T_LATCH" is the predefined latching duration, and the first type of pulse is a high frequency narrow pulse.

In the primary controller, the pulse generating module 112 outputs the first signal. In the secondary controller, the dead zone module 121 receives the first signal, and adds dead zone control to output the internal signal 1 and the internal signal 2. In the secondary controller, the starting and protecting module 122 receives the first signal, the internal signal 1 and the internal signal 2 to output the second signal and the third signal to control the first switch and the second switch, respectively.

At moment T1, the latching signal is valid, the pulse generating module 112 inserts multiple continuous first type of pulses into the first signal to form the first type of pulse sequence. As shown in FIG. 8, three narrow pulses are inserted into the first signal to form the first type of pulse sequence. At moment T2, the secondary controller has detected the first narrow pulse. Thus, the secondary controller operates in the latched mode, stops detecting the first signal, and outputs the second signal and the third signal to control the switching elements to be turned off. The second signal and the third signal are at a constant level. Thus, the switching elements remain non-conductive, and the converter including the driving and controlling circuit enters the latched state. At moment T3, the pulse generating module stops inserting the first type of pulse, and terminates the first type of pulse sequence. The pulse generating module outputs the first signal at a constant low level, and the secondary controller maintains the latched state. At moment T4, the predefined latching duration T_LATCH is reached, the secondary controller switches to a standby mode, and wait the primary controller to send the second type of pulse which is the normal driving pulse. In order to reliably turn off the switching elements, the secondary controller stops detecting the first signal during the latching duration T2-T4.

After the moment T4, the secondary controller keeps on detecting the transition edge of the first signal. At this moment, the second signal and the third signal output by the secondary controller are still at an equal and constant level to control the switching elements to be off. The latched state is maintained. At moment T5, the latching signal is invalid, and the primary controller begins sending the second type of pulse. The secondary controller detects the transition edge, and begins outputting the second signal and the third signal to control the switching elements to turn on alternatively, entering the normal working state. At the moment T5, the primary controller releases the driving circuit from lock-out. The secondary controller is in a ready state, and detects the transition edge that belongs to a normal driving pulse. That is, the secondary controller detects the second type of pulse. At the moment T5, the secondary controller begins to receive the normal driving pulse and outputs complementary switching signals to control the switching elements to turn on alternatively for performing power conversion. And the system can implement rapid handover from latching to starting.

In case the narrow pulse is wider than the dead zone time, the dead zone module receives the first type of pulse sequence, adds the dead zone and outputs the internal signal 1 and the internal signal 2 as complementary signals with dead zones. Whereas, within the duration of T2-T5, the driving and controlling system turns off the switching elements in response to the latching event. The starting and protecting module pulls down the internal signal 1 and the internal signal 2 simultaneously, to output the second signal and the third signal at constant low level. During the duration of T2-T5, the latching signal is valid, and the secondary controller generates the second signal and the third signal which are at an equal and constant level, to respectively control the first switch and the second switch to turn off. At the moment T5, the latching signal is invalid, and the secondary controller detects the transition edge in the first signal, and outputs the second signal and the third signal as complementary signals with dead zones. That is, the secondary controller outputs the internal signal 1 and the internal signal 2.

The latching duration T_LATCH begins from a moment at which an M-th pulse of the first type of pulse sequence terminates, and M is an integer, $1 \leq M \leq N$. In this embodiment, the latching duration T_LATCH begins from a moment at which the first pulse of the first type of pulse sequence terminates, which corresponds to the moment T2 in FIG. 8. At this moment, the secondary controller detects a complete first type of pulse. The latching duration T_LATCH terminates at a moment later than or equal to when a last pulse of the first type of pulse sequence ends. The latching duration T_LATCH terminates at a moment later than the moment T3 in FIG. 8. As shown in FIG. 8, the latching duration in this embodiment is the duration of T2-T4. Of course, this embodiment is not limited thereto, and those skilled may define them as practically required to achieve more desirable results.

In this embodiment, the first type of pulse signal has a width of 100 ns, and the first type of pulse sequence includes three of the first type of pulses. At the same hardware setup, the minimum interval of re-starting may be shortened down to 500 ns. This creates cost effectiveness. The driving and controlling system of the invention has cost-efficiency, whereas it can realize rapid latching, and a more rapid handover from the latched state to the working state.

Figure 9:
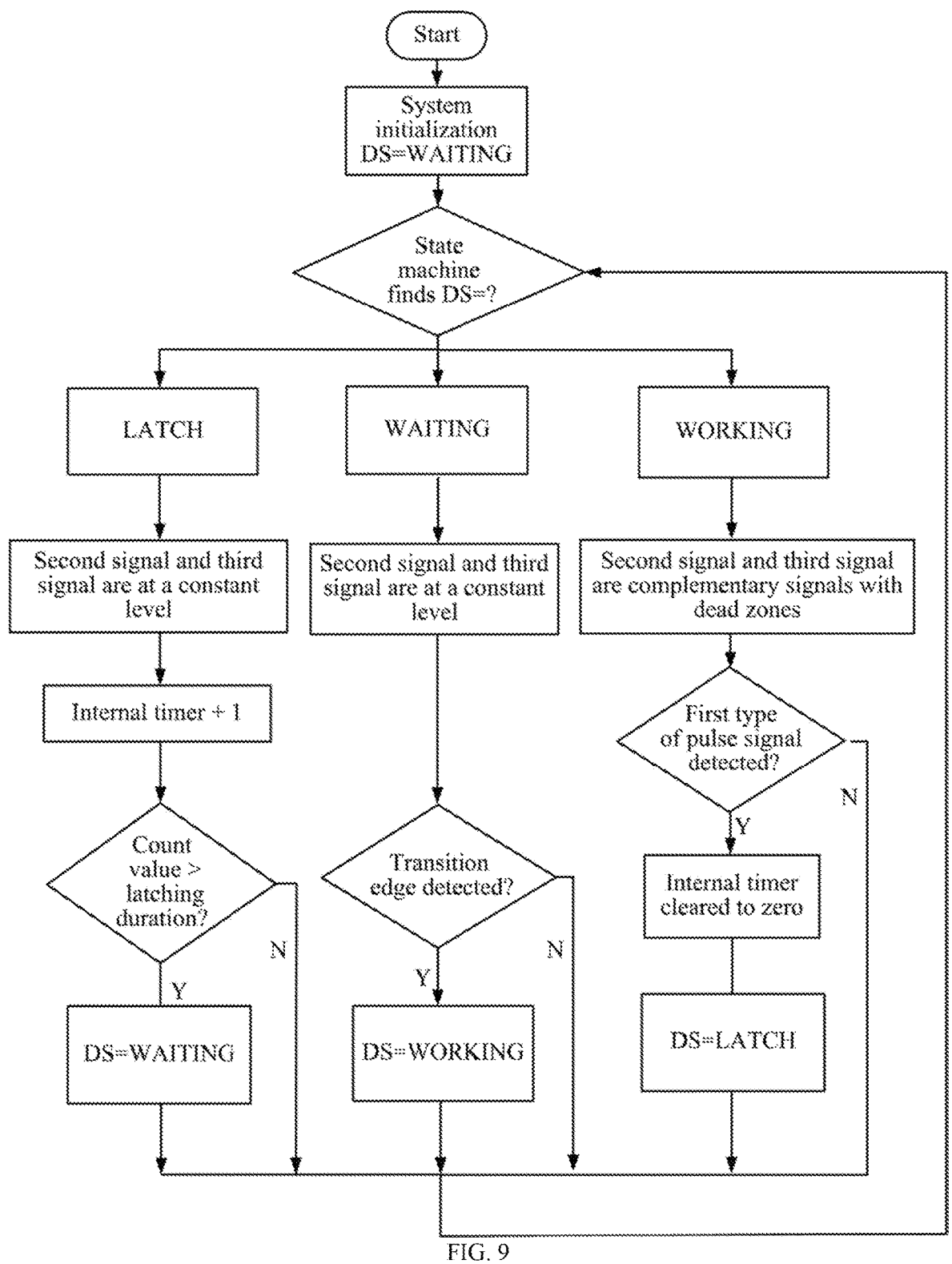
FIG. 9 is a logical flowchart of a driving and controlling method for a switching element as provided in Embodiment 3 of the disclosure.

FIG. 9 is a logical flowchart of a driving and controlling method as provided in Embodiment 3 of the disclosure. Reference may be made to FIG. 7, FIG. 8 and FIG. 9 for an illustration of the logic flow in this embodiment. In a driving and controlling circuit of the disclosure, a status variable (DS) of a state machine may be set to one of the three states: latched (LATCH), waiting (WAITING) and normal working (WORKING). When the system is initiated, the DS is equal to WAITING, and the state machine may be operated in real time to determine a current value for the DS.

When DS is equal to LATCH, the driving and controlling circuit is in the latched state, and the secondary controller operates in the latched mode. According to the latched mode, the secondary controller stops detecting the first signal, and outputs the second signal and the third signal to control the switching elements to be turned off. The second signal and the third signal are at a constant level. A count value of an internal timer is incremented by one. Compare the counter with the latching duration, and when the count value of the internal timer is larger than the latching duration, DS becomes WAITING and the secondary controller switches to the waiting mode. When the count value is smaller than the latching duration, return to the step where the state machine makes the determination, and the internal timer continues timing.

When DS is WAITING, the driving and controlling system is in the waiting state and the secondary controller operates in a waiting mode. According to the waiting mode, the secondary controller continuously detects the transition edge in the first signal, and outputs the second signal and the third signal to control the switching elements to be turned off. The levels of the second signal and the third signal are constant. When the transition edge is detected, DS becomes WORKING, and the secondary controller switches to the normal working state. When the transition edge is not detected, return to the step where the state machine makes the determination, and continue to detect the transition edge. In this embodiment, the latching duration is provided, and the detection of the transition edge in the waiting mode is equivalent to the detection of the second type of pulse.

When DS is WORKING, the driving and controlling system is at the normal working state, and the secondary controller operates in the working mode. According to the working mode, the secondary controller outputs the second signal and the third signal as complementary signals with dead zones, controlling the switching elements to work as normal. In the working mode, the secondary controller still detects the first type of pulse. And when the first type of pulse has been detected, the count value of the internal timer is cleared to zero, DS becomes LATCH, and the secondary controller switches to the latched mode. When first type of pulse is not detected, return to the step where the state machine makes the determination, and continue to detect the first type of pulse.

Further, in the latched mode and waiting mode, the driving and controlling circuit outputs the switching signals to control the switching elements to be turned off, and the converter including the circuit is in the latched state.

Figure 10:
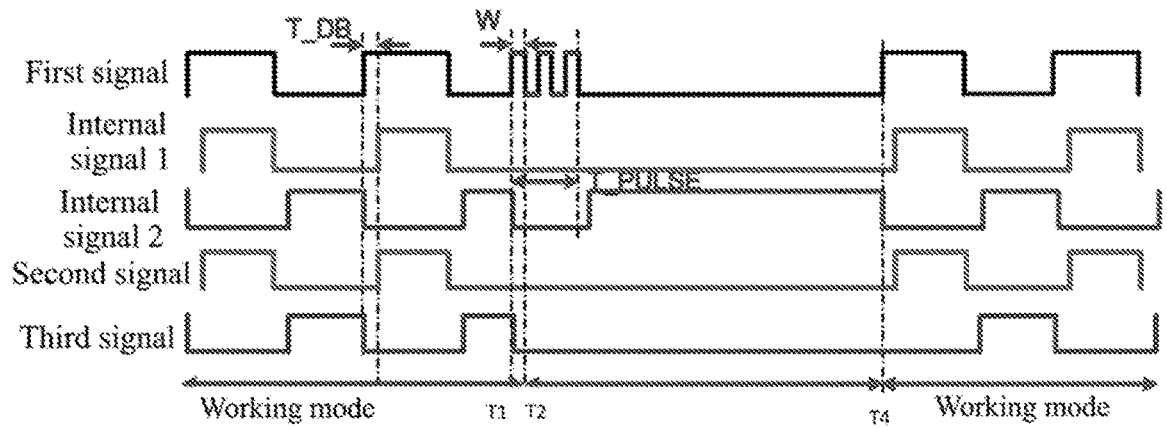
FIG. 10 is a waveform diagram of a driving and controlling method as provided in Embodiment 4 of the disclosure.

FIG. 10 is a waveform diagram of a driving and controlling system as provided in Embodiment 4 of the disclosure. In FIG. 7, the multiple switching elements may include a first switch and a second switch connected in series. Referring to FIG. 7 and FIG. 10 together, "W" is the width of the first type of pulse, "T_PULSE" is the duration of the first type of pulse sequence, and "T_DB" is the dead zone time. The first type of pulse is a high frequency narrow pulse. The first type of pulse has a width W less than or equal to the dead zone time T_DB.

In the primary controller, the pulse generating module 112 outputs the first signal. In the secondary controller, the dead zone module 121 receives the first signal, adds the dead zone control to output the internal signal 1 and the internal signal 2. In the secondary controller, the starting and protecting module 122 receives the first signal, the internal signal 1 and the internal signal 2 to output the second signal and the third signal to control the first switch and the second switch, respectively.

At moment T1, the latching signal is valid, the pulse generating module 112 begins inserting multiple continuous first type of pulses into the first signal to form the first type of pulse sequence. As shown in FIG. 8, three narrow pulses are inserted into the first signal to form the first type of pulse sequence. At moment T2, the secondary controller has detected the first narrow pulse, switches into the waiting mode, and outputs the second signal and the third signal to control the switching element to be turned off. In the waiting mode, the secondary controller continuously detects for the first signal. When the second narrow pulse arrives, the secondary controller detects the transition edge in the first signal and switches to the working state. Since the first type of pulse has the width less than or equal to the dead zone time, the narrow pulse is overridden by the dead zone. After receiving the first type of pulse sequence, the dead zone module outputs the internal signal 1 and the internal signal 2 at an equal level, so that the second signal and the third signal are at an equal level, and the switching element keeps off. When the secondary controller determines the pulse received to be the first type of pulse according to the duration of the pulse, the secondary controller then switches to the waiting mode. While the primary controller is sending the first type of pulse sequence, the transition edge detected by the secondary controller belongs to the first type of pulse. Thus, the secondary controller repeatedly switches between the waiting mode and the working mode, while the switching element remains non-conducted. Herein the circuit is in the latched state.

When the first type of pulse sequence terminates, the first signal remains at a constant level, and the secondary controller remains in the waiting mode. At moment T4, the latching signal is invalid, and the primary controller begins sending the second type of pulse. The secondary controller detects the transition edge, and outputs the second signal and the third signal to control the switching elements to turn on alternatively. The switching elements and the system are entering the normal working state. At the moment T4, the primary controller releases the driving circuit from lock-out and commences sending the second type of pulse. The secondary controller is in a ready state, and detects the transition edge that belongs to the normal driving pulse. That is, the secondary controller detects the second type of pulse. Beginning from the moment T4, the secondary controller receives the normal driving pulse and outputs complementary switching signals to control the switching elements to turn on alternatively for performing power conversion. And the system can implement rapid handover from latching to starting.

During the duration of T1-T4, the latching signal is valid, and the secondary controller generates the second signal and the third signal to respectively control the first switch and the second switch to turn off. At this moment, the second signal and the third signal have an equal and constant level. At the moment T4, the latching signal is invalid, and the secondary controller detects the second type of pulse and outputs the second signal and the third signal as complementary signals with dead zones. That is, the secondary controller outputs the internal signal 1 and the internal signal 2.

Since the width of the first type of pulse is less than the width of the dead zone, the inserted narrow pulse will not cause the switching to be triggered repeatedly, thereby avoiding interference. Thus, the switching element may be reliably turned off, and the latching duration is unnecessary. The driving signals can be blocked as quickly as possible. The handover time from the latched state to the normal working state may be reduced down to the duration of one narrow pulse. The driving and controlling circuit of the invention can be cost-effectively, realize rapid latching, reduced delay, and more rapid handover from the latched state to the normal working state.

Figure 11:
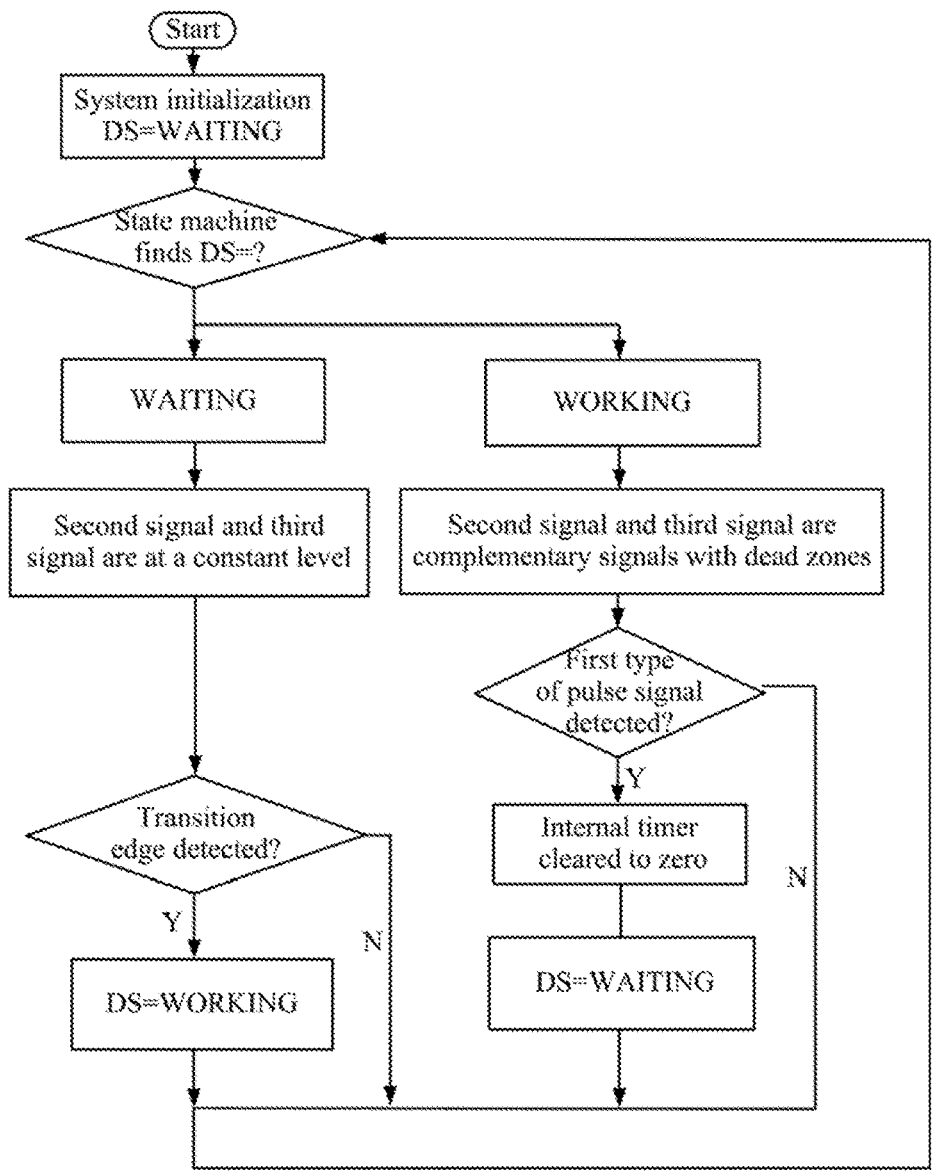
FIG. 11 is a logical flowchart of a driving and controlling method for a switching element as provided in Embodiment 4 of the disclosure.

FIG. 11 is a logical flowchart of a driving and controlling method as provided in Embodiment 4 of the disclosure. Reference may be made to FIG. 7, FIG. 10 and FIG. 11 for an illustration of the logic flow in this embodiment. In the driving and controlling circuit of the disclosure, a status variable (DS) of a state machine may be set as two states which are waiting (WAITING) and normal working (WORKING). When the circuit is initiated, the DS is equal to WAITING, and the state machine may be operated in real time to determine a current value for the DS.

When DS is WAITING, the driving and controlling circuit is in the latching state, and the secondary controller operates in the waiting mode. According to the waiting mode, the secondary controller continuously detects the transition edge in the first signal, and outputs the second signal and the third signal to control the switching element to be turned off. The levels of the second signal and the third signal are constant. When the transition edge is detected, DS becomes WORKING, and the secondary controller switches to the normal working state. When the transition edge is not detected, return to the step where the state machine makes the determination, and continue to detect the transition edge.

When DS is WORKING, the driving and controlling circuit is at the normal working state, and the secondary controller operates in the working mode. According to the working mode, the secondary controller outputs the second signal and the third signal as complementary signals with dead zones. In the working mode, the detection for the first type of pulse continues. When the first type of pulse has been detected, DS becomes WAITING, and the secondary controller switches to the waiting mode. The count value of the internal timer is cleared to zero. When the first type of pulse is not detected, return to the step where the state machine makes the determination, and continue detecting the first type of pulse.

In this embodiment, the latching duration does not need to be configured. The transition edge detected in the waiting mode belongs to the transition edge of the first type of pulse or the transition edge of the second type of pulse. When the primary controller sends the first type of pulse sequence, the transition edge is the transition edge of the first type of pulse. For example, when the primary controller sends the first type of pulse sequence, the transition edge is the rising edge of the first type of pulse. Since the first type of pulse has the pulse width less than or equal to the dead zone time, the first type of pulse is overridden by the dead zone. The switching signals output are at an equal level, and the switching elements are turned off. After the primary controller releases the blocking on the driving pulse, and the transition edge detected is the transition edge of the second type of pulse. For example, the secondary controller has detected the rising edge of the second type of pulse. Getting the transition edge of the second type of pulse means detecting the second type of pulse. The output switching signals become complementary signals, and the switching elements work as normal.

In an optional embodiment, the pulse width of the first type of pulse is wider that of the second type of pulse. In the present application, the pulse width of the first type of pulse is different from that of the second type of pulse.

In an optional embodiment, the isolation communication unit includes an optic fiber. The driving and controlling circuit of the disclosure may be applied to any occasion in which a medium such as an optic fiber is needed to directly transmit driving information. The topology includes, but is not limited to: two-level half-bridge circuit, three-level half-bridge circuit and cascade two-level half-bridge circuit.

Figure 12A:
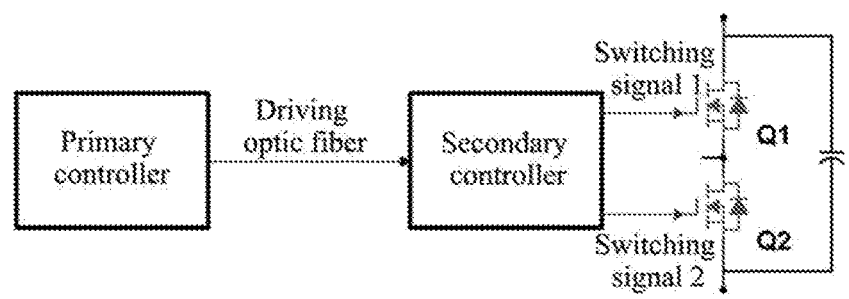
FIG. 12(a) is a first schematic structural view of a driving and controlling circuit for a switching element as provided in Embodiment 5 of the disclosure.
Figure 12B:
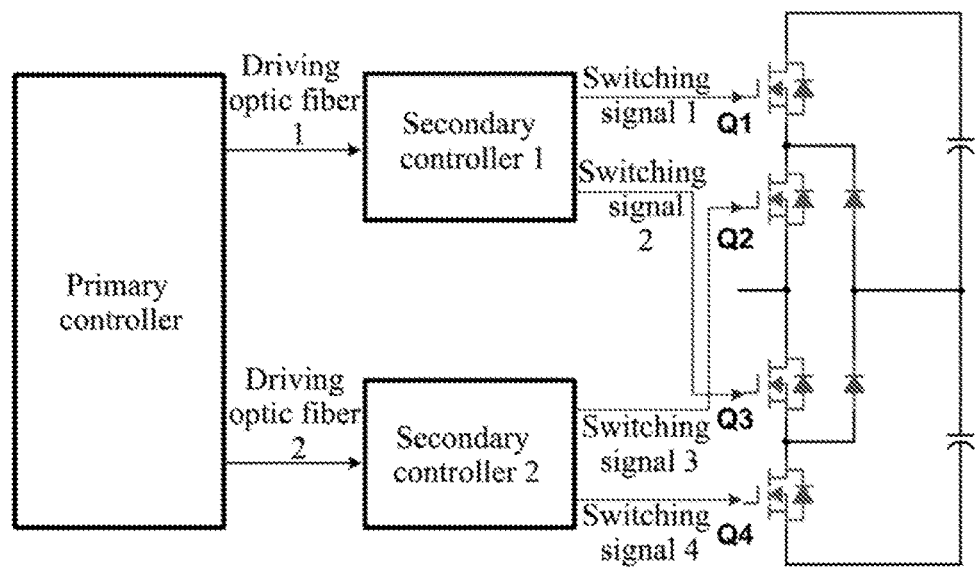
FIG. 12(b) is a second schematic structural view of the driving and controlling circuit for the switching element as provided in Embodiment 5 of the disclosure.
Figure 12C:
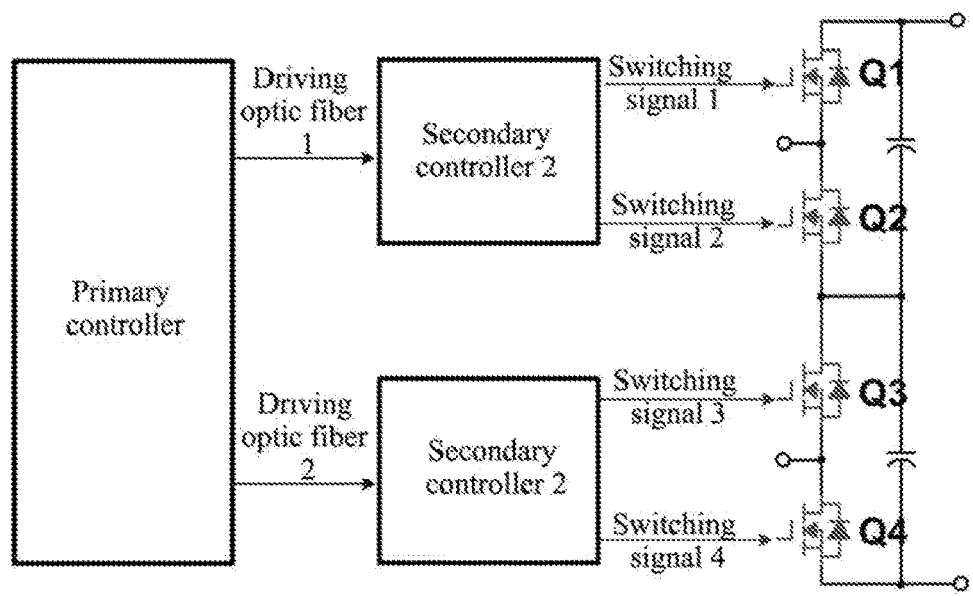
FIG. 12(c) is a third schematic structural view of the driving and controlling circuit for the switching element as provided in Embodiment 5 of the disclosure.

Specifically, reference may be made to FIGS. 12(*a*), 12(*b*) and 12(*c*). FIG. 12(*a*) is the first schematic structural view of a driving and controlling circuit as provided in Embodiment 5 of the disclosure. FIG. 12(*b*) is the second schematic structural view of a driving and controlling circuit as provided in Embodiment 5 of the disclosure. FIG. 12(*c*) is the third schematic structural view of a driving and controlling circuit as provided in Embodiment 5 of the disclosure. As shown in FIG. 12(*a*), the switching elements form a two-level half-bridge circuit, the isolation communication circuit includes single driving optic fiber to transmit driving information between the primary controller and the secondary controller, and the secondary controller outputs two groups of switching signals to drive one group of complementary switches. As shown in FIG. 12(*b*), the switching elements form a three-level half-bridge circuit, the isolation communication circuit includes single driving optic fiber to transmit driving information between the primary controller and the secondary controllers, and the secondary controllers output four groups of switching signals to drive two groups of complementary switches. As shown in FIG. 12(*c*), the switching elements form a cascade two-level half-bridge circuit, the isolation communication circuit includes single driving optic fiber to transmit driving information between the primary controller and the secondary controllers, and the secondary controllers output four groups of switching signals to drive two groups of cascade switches. The driving and controlling system of the disclosure may also drive two-level full-bridge circuit and three-level full-bridge circuit.

By implementing the driving and controlling method and circuit of the disclosure, rapid latching and re-starting of the driving pulses may be realized. By using single optic fiber to transfer driving and latching information in a time divisional manner, the number of the optic fibers can be saved, so that the cost is reduced. Transmitting the driving information directly via the optic fiber allows for short driving delay and high accuracy.

Since the level is maintained constant between the first type of pulse sequence and the second type of pulse sequence, an advantage is obtained in realizing rapid switching between latching and starting. The driving and controlling method and circuit of the disclosure is beneficial to high-frequency switching, and applies to restricted operations such as the high-frequency Burst switching, the Cycle-by-Cycle current-limiting protection and so on.

Finally, it should be noted that the foregoing embodiments are merely intended for describing, rather than limiting, the technical solutions of the present disclosure. Although the present disclosure is described in detail with reference to the foregoing embodiments, persons of ordinary skill in the art should understand that they may still make modifications to the technical solutions described in the foregoing embodiments, or make equivalent replacements to some or all technical features therein. However, these modifications or replacements do not make the essence of corresponding technical solutions depart from the scope of the technical solutions in the embodiments of the present disclosure.

What is claimed is:

1. A driving and controlling method, applied to a driving and controlling circuit for driving multiple switching elements, the driving and controlling circuit comprising a primary controller, a secondary controller, and an isolation communication unit, the primary controller being coupled to the secondary controller via the isolation communication unit, the secondary controller being coupled to the switching elements, and the method comprising:
sending, by the primary controller, a first signal that comprises a first type of pulse sequence and a second type of pulse sequence;
receiving, by the secondary controller, the first signal, and identifying a pulse type of the first signal;
when a first type of pulse is detected, outputting, by the secondary controller, multiple switching signals to respectively control the multiple switching elements to turn off;
when a second type of pulse is detected, outputting, by the secondary controller, multiple switching signals to respectively control the multiple switching elements to work as normal;
wherein a level of the first signal is maintained constant between the first type of pulse sequence and the second type of pulse sequence.

2. The driving and controlling method according to claim 1, wherein the multiple switching elements comprise a first switch and a second switch, the secondary controller receives the first signal and then outputs a second signal and a third signal to control the first switch and the second switch, respectively;
when the first type of pulse is detected, outputting the second signal and the third signal at an equal and constant level;
when the second type of pulse is detected, outputting the second signal and the third signal as complementary signals with dead zones.

3. The driving and controlling method according to claim 1, wherein the sending, by the primary controller, a first signal comprises:
generating a latching signal, wherein, when the latching signal is valid, the primary controller sends the first type of pulse sequence which comprises N first type of pulses, N being an integer greater than or equal to one;
when the latching signal is invalid, the primary controller sends the second type of pulse sequence.

4. The driving and controlling method according to claim 1, wherein a pulse width of the first type of pulse is smaller than that of the second type of pulse.

5. The driving and controlling method according to claim 1, wherein:
when the first type of pulse has been detected, the secondary controller operates in a latched mode and stops detecting the first signal;
when a latching duration is reached, the secondary controller switches to a waiting mode and detects a transition edge in the first signal; and
when the transition edge is detected, the secondary controller switches to a working mode.

6. The driving and controlling method according to claim 5, wherein the first type of pulse sequence comprises N first type of pulses, the latching duration begins from a moment at which an M-th pulse of the first type of pulse sequence terminates, and the latching duration terminates at a moment which is later than or equal to the moment of the first type of pulse sequence being terminated, wherein N is an integer, N≥1, and M is an integer, 1≤M≤N.

7. The driving and controlling method according to claim 5, wherein, when the secondary controller is in the latched mode or the waiting mode, the multiple switching signals are at an equal and constant level; and when the secondary controller is in the working mode, the multiple switching signals are complementary signals with dead zones.

8. The driving and controlling method according to claim 1, wherein:
when the first type of pulse is detected and a pulse width thereof is less or equal to a dead time, the secondary controller switches to a waiting mode and detects a transition edge in the first signal; and
when the transition edge is detected, the secondary controller switches to a working mode.

9. The driving and controlling method according to claim 8, wherein, when the secondary controller is in the waiting mode, the multiple switching signals are at an equal and constant level; and when the secondary controller is in the working mode, the multiple switching signals are complementary signals with dead zones.

10. A driving and controlling circuit, comprising:
a primary controller configured to send a first signal that comprises a first type of pulse sequence and a second type of pulse sequence;
an isolation communication unit coupled to the primary controller and configured to transmit the first signal;
a secondary controller coupled between the isolation communication unit and multiple switching elements, and configured to receive the first signal and output multiple switching signals to respectively control the multiple switching elements;
wherein:
when a first type of pulse is detected, the secondary controller outputs multiple switching signals to respectively control the multiple switching elements to turn off; and
when a second type of pulse is detected, the secondary controller outputs multiple switching signals to respectively control the multiple switching elements to work as normal;
wherein a level of the first signal is maintained constant between the first type of pulse sequence and the second type of pulse sequence.

11. The driving and controlling circuit according to claim 10, wherein the primary controller comprises:
a latching module configured to detect a latching event and output a latching signal;
a pulse generating module electrically connected to the latching module, and configured to receive the latching signal and generate the first signal;
wherein when the latching signal is valid, the pulse generating module outputs the first type of pulse sequence; and when the latching signal is invalid, the pulse generating module outputs the second type of pulse sequence.

12. The driving and controlling circuit according to claim 11, wherein when the latching signal is valid and the first type of pulse sequence terminates, the pulse generating module outputs a constant level.

13. The driving and controlling circuit according to claim 10, wherein the secondary controller comprises:
a dead zone module configured to receive the first signal and convert the first signal into multiple internal signals that are complementary signals with dead zones;
a starting and protecting module electrically connected to the dead zone module and the isolation communication unit, and configured to receive the multiple internal signals and the first signal, and identify a pulse type of the first signal;
wherein when the first type of pulse is detected, the starting and protecting module outputs the multiple switching signals at an equal and constant level; and
when the second type of pulse is detected, the starting and protecting module outputs the multiple internal signals.

14. The driving and controlling circuit according to claim 13, wherein:
when the latching signal is invalid, the starting and protecting module outputs the multiple switching signals as complementary signals with dead zones to cause the switching elements to work as normal; and
when the latching signal is valid, the starting and protecting module outputs the multiple switching signals at an equal and constant level to cause the multiple switching elements to stop working.

15. The driving and controlling circuit according to claim 10, wherein the first type of pulse sequence comprises N first type of pulses, N being an integer, N≥1, and a pulse width of the first type of pulse is less than that of the second type of pulse.

* * * * *